(12) United States Patent
Holzmann

(10) Patent No.: US 9,263,218 B2
(45) Date of Patent: Feb. 16, 2016

(54) VARIABLE RESISTANCE MEMORY CELL BASED ELECTRICALLY RESETTABLE FUSE DEVICE

(71) Applicant: Nuvoton Technology Corporation, Hsinchu (TW)

(72) Inventor: Peter Holzmann, San Jose, CA (US)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 14/286,941

(22) Filed: May 23, 2014

(65) Prior Publication Data

US 2015/0340187 A1    Nov. 26, 2015

(51) Int. Cl.
| | |
|---|---|
| *H01H 85/02* | (2006.01) |
| *G11C 13/00* | (2006.01) |
| *G11C 17/16* | (2006.01) |
| *H01H 85/48* | (2006.01) |
| H01L 23/525 | (2006.01) |
| H02J 7/00 | (2006.01) |
| H01L 27/10 | (2006.01) |

(Continued)

(52) U.S. Cl.
CPC ....... *H01H 85/0241* (2013.01); *G11C 13/0002* (2013.01); *G11C 17/16* (2013.01); *H01H 85/48* (2013.01); *G06F 12/1433* (2013.01); *G11C 11/5685* (2013.01); *G11C 17/18* (2013.01); *G11C 29/76* (2013.01); *H01H 2085/0283* (2013.01); *H01L 23/5256* (2013.01); *H01L 27/101* (2013.01); *H02J 7/0036* (2013.01)

(58) Field of Classification Search
CPC .............. H01H 85/0241; H01H 85/48; H01H 2085/0283; G11C 13/0002; G11C 17/18; G11C 29/76; G11C 11/5685; H01L 23/5256; H01L 27/101; H02J 7/0036; G06F 12/1433
See application file for complete search history.

(56) References Cited

U.S. PATENT DOCUMENTS 6,570,746 B1 * 5/2003 Smith .............................. 361/18
8,081,504 B2   12/2011 Chen et al.

(Continued)

FOREIGN PATENT DOCUMENTS

| CN | 101478031 A | 7/2009 |
| CN | 102169719 A | 8/2011 |

(Continued)

OTHER PUBLICATIONS

"Bourns MF-R series—PTC Resettable Fuses Fuses," product information Bourns, Inc. (no date).

*Primary Examiner* — Richard Elms
*Assistant Examiner* — Ajay Ojha
(74) *Attorney, Agent, or Firm* — Kilpatrick Townsend & Stockton LLP

(57) ABSTRACT

An integrated circuit includes an electrically resettable fuse device. The electrically resettable fuse device has a plurality of resettable fuse modules coupled in parallel. Each resettable fuse module including a fuse element characterized by a first and a second impedance states. The plurality of resettable fuse modules are configured such that when the fuse element is in the first impedance state, and a current flowing through each fuse element in a first direction exceeds a current limit, the fuse element enters into the second impedance state. When the fuse element is in the second impedance state and, in response to a global reset signal and a local reset signal, a current is applied to the fuse element in a second direction opposite the first direction, the fuse element is reset to the first impedance state.

20 Claims, 7 Drawing Sheets

(51) Int. Cl.
*G11C 17/18* (2006.01)
*G11C 29/00* (2006.01)
*G11C 11/56* (2006.01)
*G06F 12/14* (2006.01)

(56) References Cited

U.S. PATENT DOCUMENTS

| | | |
|---|---|---|
| 8,113,437 B2 | 2/2012 | Kang |
| 8,115,188 B2 | 2/2012 | Gosain et al. |
| 8,270,226 B2 | 9/2012 | Choi et al. |
| 8,466,461 B2 | 6/2013 | Seo et al. |
| 8,477,055 B2 | 7/2013 | Choi et al. |
| 8,589,764 B2 | 11/2013 | Takeuchi et al. |
| 8,635,511 B2 | 1/2014 | Takeuchi et al. |
| 2006/0136751 A1* | 6/2006 | Bonaccio et al. ............. 713/194 |
| 2006/0250837 A1* | 11/2006 | Herner et al. ................ 365/148 |
| 2008/0251885 A1* | 10/2008 | Kobayashi ................... 257/529 |
| 2009/0236581 A1* | 9/2009 | Yoshida et al. ................... 257/2 |
| 2011/0158012 A1* | 6/2011 | Kim et al. ..................... 365/200 |
| 2012/0042200 A1 | 2/2012 | Takeuchi et al. |
| 2012/0303870 A1 | 11/2012 | Park et al. |
| 2013/0027079 A1 | 1/2013 | Nazarian et al. |
| 2013/0027081 A1 | 1/2013 | Nazarian et al. |
| 2013/0077420 A1* | 3/2013 | Iwai et al. ..................... 365/200 |
| 2013/0336041 A1 | 12/2013 | Tsai et al. |

FOREIGN PATENT DOCUMENTS

| | | | |
|---|---|---|---|
| CN | 102412827 A | 4/2012 | |
| CN | 102750985 A | 10/2012 | |
| CN | 103514947 A | 1/2014 | |
| EP | 1811564 A1 | 7/2007 | |
| JP | 2005317713 A | * 11/2005 | ............. H01L 21/82 |
| KR | 101031420 B | 4/2011 | |
| KR | 20110057839 A | 6/2011 | |

* cited by examiner

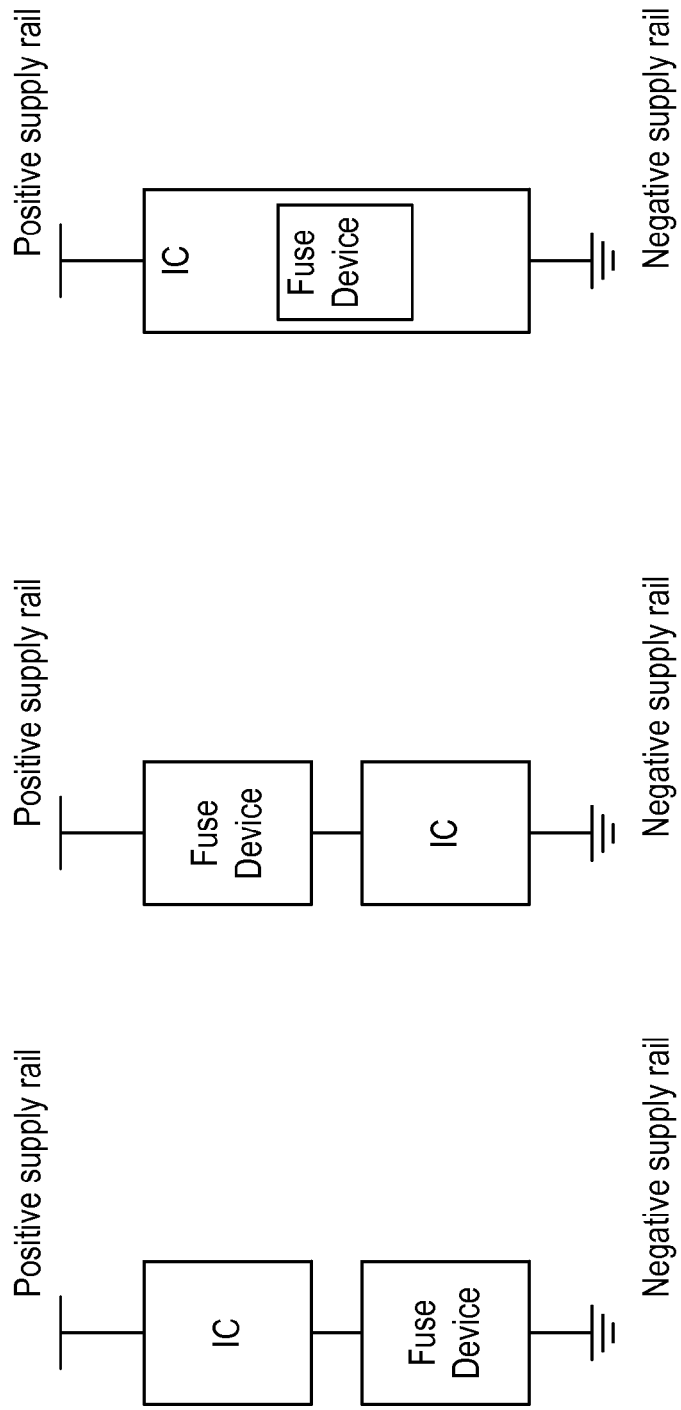

VARIABLE RESISTANCE MEMORY CELL BASED ELECTRICALLY RESETTABLE FUSE DEVICE

BACKGROUND OF THE INVENTION

The present invention relates generally to electronic circuits. More particularly, embodiments of the present invention relate to circuits and systems for an electrically resettable fuse device for integrated circuit applications.

In electronics, a fuse is a low resistance resistor that acts to provide overcurrent protection. Short circuit, overloading, mismatched loads or device failure are possible reasons for excessive current. A conventional fuse is usually a metal wire that melts when too much current flows, which interrupts the circuit in which it is connected, so that further damage by overheating or fire is prevented. Overcurrent protection devices are essential in electrical systems to limit threats to human life and property damage.

In integrated circuit (IC) applications, a fuse or anti-fuse device can be used to implement circuit design options. For example, a metal fuse can be cut open with a laser. In other cases, a high voltage can be used to breakdown a metal-insulator-metal structure to establish a conductive path.

Most conventional fuses for overcurrent protection are a 'one shot', non-resettable device which must be replaced once they have been activated or blown. On the other hand, conventional self-resetting fuses use a thermoplastic conductive element thermistor that impedes the circuit during an overcurrent condition by increasing device resistance. The thermistor is self-resetting in that when current is removed, the device will cool and revert to low resistance. These devices are often used in aerospace/nuclear applications where replacement is difficult, or on a computer motherboard so that a shorted mouse or keyboard does not cause motherboard damage.

BRIEF SUMMARY OF THE INVENTION

According to an embodiment of the present invention, an integrated circuit is provided that includes an electrically resettable fuse device. The electrically resettable fuse device has a plurality of resettable fuse modules coupled in parallel. Each resettable fuse module includes a fuse element characterized by a first and a second impedance states. The plurality of resettable fuse modules are configured such that when a fuse element is in the first impedance state, and a current flowing through each fuse element in a first direction exceeds a current limit, the fuse element enters into the second impedance state. When the fuse element is in the second impedance state and, in response to a global reset signal and a local reset signal, a current is applied to the fuse element in a second direction opposite to the first direction, the fuse element is reset to the first impedance state.

According to yet another embodiment of the present invention, an electronic circuit includes a circuit module with a maximum current tolerance and an electrically resettable fuse device. The circuit module and the electrically resettable fuse device are connected in series between a positive supply rail and a negative supply rail. The electrically resettable fuse device includes a plurality of resettable fuse modules coupled in parallel, each resettable fuse module including a fuse element characterized by a first and a second impedance states. The plurality of resettable fuse modules are configured such that when each of the fuse elements is in the first impedance state and a current flows in each of the fuse elements in a first direction, the electrically resettable fuse device is characterized by an impedance lower than a predetermined low impedance value. When a current flowing through the electrically resettable fuse device exceeds the maximum current tolerance of the circuit module, each of the fuse element enters into the second impedance state, and the electrically resettable fuse device is characterized by an impedance higher than a predetermined high impedance value. Further, when a current is applied to each fuse element in a second direction opposite the first direction, in response to reset signals, the fuse element is reset to the first impedance state.

According to some embodiments of the present invention, an electrically resettable fuse device includes a plurality of resettable RRAM (resistive random access memory) fuse modules, a global reset signal line, and a local reset signal line for each of the plurality of resettable RRAM fuse modules. Each RRAM fuse module includes an RRAM element and four switch devices. A first switch device, the RRAM element, and a second switch device are coupled in series for providing a conduction path through the RRAM element in a first direction. A third switch device, the RRAM element, and a fourth device are coupled in series for providing a conduction path through the RRAM element in a second direction.

A further understanding of the nature and advantages of the present invention may be realized by reference to the remaining portions of the specification and the drawings.

BRIEF DESCRIPTION OF THE DRAWINGS

FIGS. 7-9 are simplified block diagrams illustrating various configurations for an electronic circuit having an electrically resettable fuse device according to embodiments of the present invention.

DETAILED DESCRIPTION OF THE INVENTION

The inventors have observed that some fuse devices suffer from many limitations. For example, some fuses are often incompatible with many integrated circuit applications. Some fuse devices may require a large device area or a high voltage to operate. Other known fuse devices cannot be reset electrically. The self-resetting fuses using a thermoplastic conductive elements are not suitable for integrated circuit applications because the resetting features are not controllable with a control signal.

In embodiments of the present invention, an electrically resettable fuse device uses a non-volatile resistive device that is compatible with integrated circuit processes, does not require a large device area or a high voltage or high current operation. In some embodiments, a control circuit is provided to enable electrically resetting the fuse device in response to control signals. An electrically resettable fuse device may include a parallel combination of a plurality of fuse module, which provides flexibility in adjusting the desirable impedance. For example, the impedance of the fuse during normal operation can be reduced by the parallel configuration of multiple fuse modules. In some embodiments, a staggered reset operation can be deployed such that the fuse modules are reset in a sequential manner. In this arrangement, the current requirement and power consumption of the reset operation can be greatly reduced. The electrically resettable fuse device is suitable for use with an integrated circuit. It can also be integrated in the same IC chip with an application circuit.

The description below refers to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Figure 1:
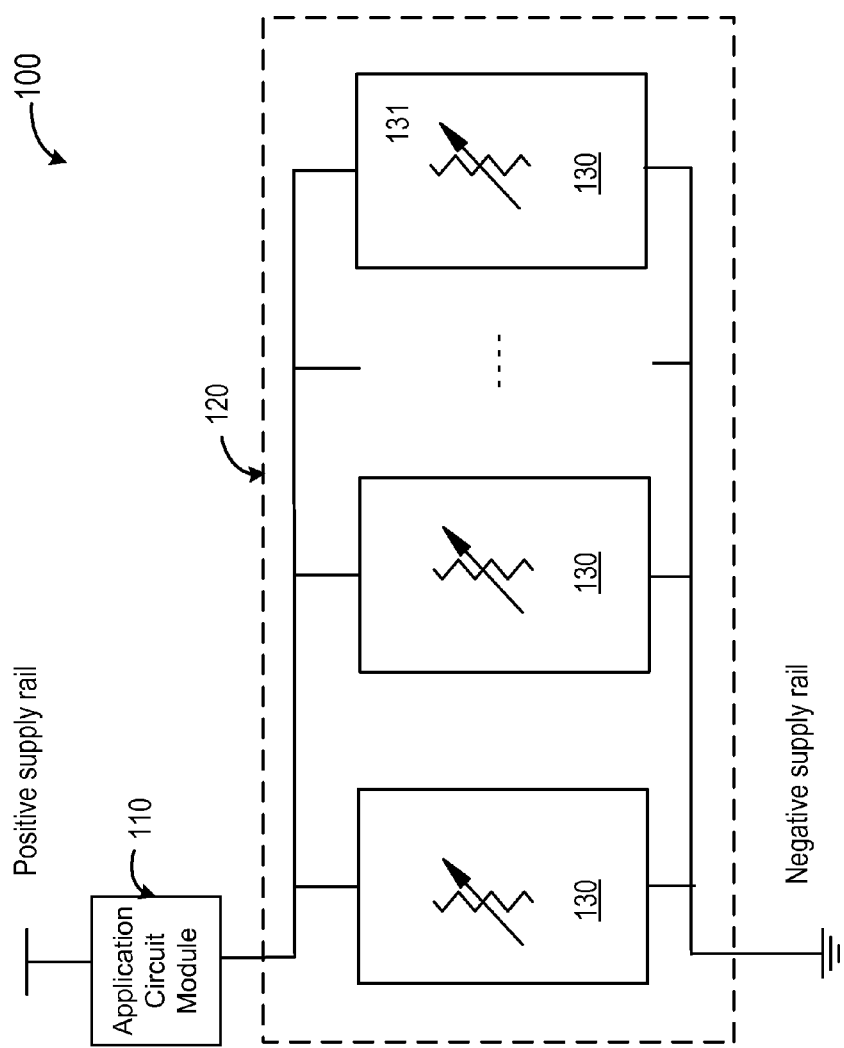
FIG. 1 is a simplified block diagram illustrating an integrated circuit with an electrically resettable fuse device according to an embodiment of the present invention.

FIG. 1 is a simplified block diagram illustrating an integrated circuit with an electrically resettable fuse device according to an embodiment of the present invention. As shown in FIG. 1, integrated circuit 100 includes an application circuit module 110 and an electrically resettable fuse device 120. In FIG. 1, application circuit module 110 and an electrically resettable fuse device 120 are coupled in series between a positive supply rail (also can be referred to as power supply, VCC, or VDD) and a negative supply rail (also can be referred to as ground or VSS). However, there can also be other configurations, as described below.

Application circuit module 110 can be any IC circuit modules, for example, a processor, a memory, a digital, or an analog circuit. Circuit module 110 usually is specified with a maximum current tolerance. A current higher than the maximum current tolerance can cause irreversible damages to the circuit. Therefore, it's desirable to have a fuse device to provide protection against such overcurrent conditions.

As shown in FIG. 1, electrically resettable fuse device 120 includes a plurality of resettable fuse modules 130 coupled in parallel. Each resettable fuse module 130 including a fuse element 131 characterized by a first and a second impedance states. The plurality of resettable fuse modules 130 are configured such that when each of the fuse element is in the first impedance state, electrically resettable fuse device 120 is characterized by an impedance lower than a predetermined low impedance value. In this case, the predetermined low impedance value is selected to sustain small voltage drop, such that application circuit module 110 can operate satisfactorily, and the fuse device does not cause unacceptable power consumption. Resettable fuse modules 130 are also configured such that when a current flowing through each fuse element in a first direction, e.g., from the positive supply rail to the negative supply rail, exceeds a current limit, each of the fuse element enters into the second impedance state. The current limit can be selected to prevent the current flow in the application circuit module 110 from exceeding a safe limit. In the second impedance state, or high impedance state, electrically resettable fuse device 120 is characterized by an impedance higher than a predetermined high impedance value. For example, the high impedance value can be selected such that a substantial amount of voltage drop between the positive supply rail to the negative supply rail is sustained by the fuse device, and little or no current is allowed to flow in the application circuit module. In this case, ideally, electrically resettable fuse device 120 operates more or less like an open circuit. When it is desirable for the fuse device to return to the low impedance state, a current is applied to each fuse element in a second direction opposite the first direction, and the fuse element is reset to the first impedance state. Thus, as used herein, "reset" refers to returning the fuse device (or specifically, the fuse element contained in the fuse device) to its normal operation state, e.g., the low impedance state.

In some embodiments, each of the fuse element can be a non-volatile resistive element whose conductive state can be altered by the application of an electrical current or voltage. For example, an RRAM (resistive random-access memory) element or a PRAM (phase change random-access memory) element is a non-volatile resistive element that can have two impedance states, a high impedance state and a low impedance state. An RRAM or PRAM element can be a normally insulating dielectric, which can be made to conduct through a conduction path formed after application of a sufficiently voltage or current. A large number of inorganic and organic material systems showing thermal or ionic resistive switching effects have been demonstrated in the literature. These has been grouped into the different categories including phase change chalcogenides like Ge2Sb2Te5 or AgInSbTe, binary transition metal oxides like NiO or TiO2, perovskites like Sr(Zr)TiO3 or PCMO, solid-state electrolytes like GeS, GeSe, SiOx or Cu2S, organic charge transfer complexes like CuTCNQ, organic donor-acceptor systems like Al AIDCN, and various molecular systems. Further details about RRAM devices and methods for making RRAM devices have been reported in the art, for example, U.S. Pat. No. 8,466,461 by Seo et al. and U.S. Patent Application Publication No. 20130336041 by Tsai, et al., both of which are incorporated by reference herein. In another embodiment, each of the fuse elements can be a MRAM (magneto-resistive random-access memory), a CBRAM (conductive bridge random-access memory) or any other memory capable of implementing the embodiment of the invention.

It is understood that the detail circuit implementation may need to be tailored for each different kind of memory element according to the invention disclosed herein. For example, some embodiments use an RRAM (resistive random-access memory) element, which may change resistance states depending on the electrical signals applied to the fuse element, e.g, the direction of current flow. On the other hand, certain PRAM (phase change random-access memory) elements are known to operate, for example, by thermally-activated process to switch between a crystalline low-resistance state and an amorphous high-resistance state.

Figure 2:
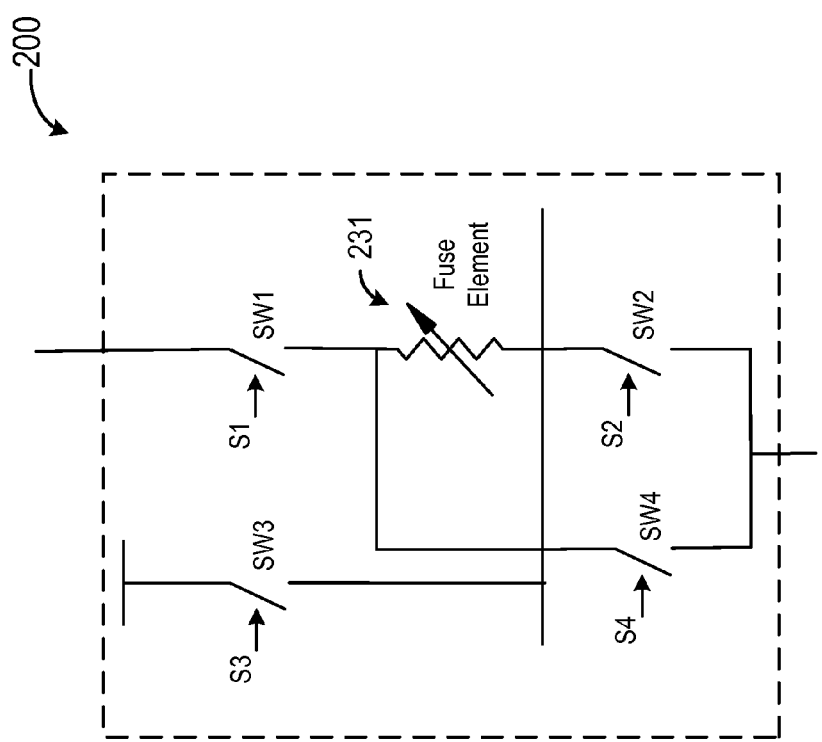
FIG. 2 is a simplified schematic diagram illustrating a resettable fuse module which can be part of the electrically resettable fuse device of FIG. 1 according to an embodiment of the present invention.

FIG. 2 is a simplified schematic diagram illustrating a resettable fuse module 200 which can be part of the electrically resettable fuse device of FIG. 1 according to an embodiment of the present invention. As shown in FIG. 2, resettable fuse module 200 includes a fuse element 231, and first, second, third, and fourth switch devices SW1, SW2, SW3, and SW4, coupled to the fuse element. Also shown in FIG. 2 are control signals S1, S2, S3, and S4 associated with the switch devices. These control signals are used to control the on and off of the switch device. The control signals can be provided by a control circuit, which can be part of the application circuit module, part of the resettable fuse device, or a separate circuit module, depending on the embodiment.

During a normal operation, first switch device SW1 and second switch device SW2 are closed, and third switch device SW3 and fourth switch device SW4 are open. Under this condition, the first switch device SW1, the fuse element 231, and the second switch device SW2 are coupled in series for providing a conduction path through the fuse element in the first direction, e.g., from the positive supply rail to the negative supply rail. When the current flowing through fuse element 231 exceeds a certain limit, fuse element 231 is transformed into the high impedance state. Under this condition, fuse element can operate like an open circuit.

During a reset operation, the third switch SW3 and the fourth switch SW4 are closed, and first switch device SW1 and second switch device SW2 are open. In this embodiment, SW3 is coupled to a power supply. Under this condition, the third switch device SW3, the fuse element 231, and the fourth switch device SW4 are coupled in series for providing a conduction path through the fuse element 231 in the second direction opposite to the first direction. When the current in the fuse element 231 in the second direction reaches a required transition current, fuse element is reset into the low impedance state. In some embodiments, an initial reset operation can be carried out to set the fuse elements in the low impedance state.

Referring back to FIG. 1, electrically resettable fuse device 120 includes multiple fuse modules 130 coupled in parallel. In some embodiments, all the fuse modules can be reset at the same time, which would require a reset voltage or current to be supplied to each fuse module simultaneously. In alternative embodiments, the fuse modules can be reset sequentially. For example, in a reset operation, the conduction path for reset in each resettable fuse module can be provided in a staggered time sequence, thereby reducing the power needed for resetting the electrically resettable fuse device 120.

Figure 3:
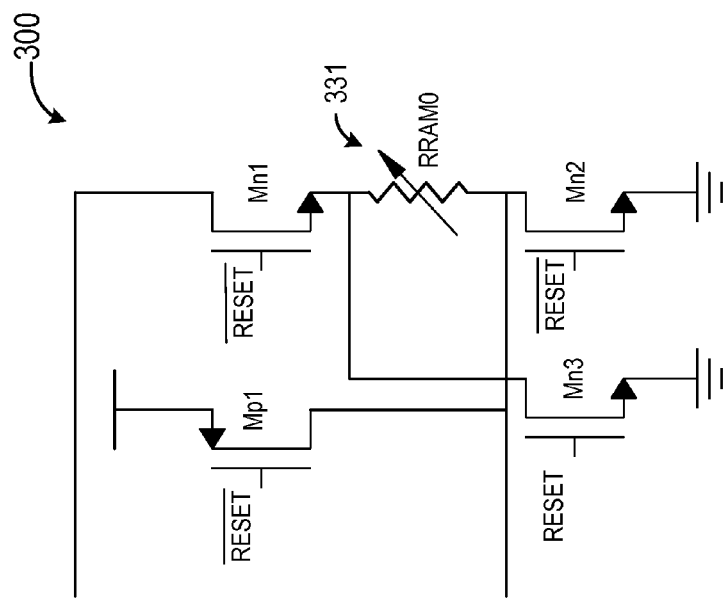
FIG. 3 is a simplified schematic diagram illustrating a resettable fuse module having a global reset signal, which can be part of the electrically resettable fuse device of FIG. 1 according to another embodiment of the present invention.

FIG. 3 is a simplified schematic diagram illustrating a resettable fuse module with a global reset signal, which can be part of the electrically resettable fuse device of FIG. 1 according to another embodiment of the present invention. As shown in FIG. 3, resettable fuse module 300 includes a fuse element 331. In this embodiment, the fuse element is made of an RRAM material. Further, please refer to FIG. 2, in resettable fuse module 300, the first switch device is a first NMOS transistor Mn1, the second switch device is a second NMOS transistor Mn2, the third switch device is a first PMOS transistor Mp1, and the fourth switch device is a third NMOS transistor Mn3. FIG. 3 also shows the control signals for the switch devices. The first NMOS transistor Mn1 is coupled to the inverse of a global reset signal RESET, the second NMOS transistor Mn2 is coupled to the inverse of the global reset signal RESET, the first PMOS transistor Mp1 is coupled to the inverse of the global reset signal RESET, and the third NMOS transistor Mn3 is coupled to the global reset signal RESET. In resettable fuse module 300, the reset is controlled by global reset signal RESET and its inverse signal, and can be carried out simultaneously.

Figure 4:
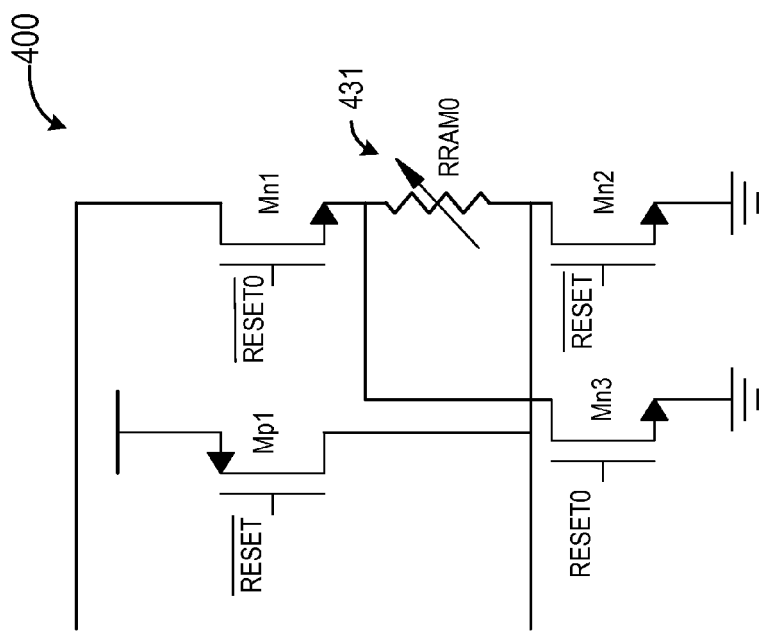
FIG. 4 is a simplified schematic diagram illustrating a resettable fuse module having a global reset signal and local reset signals, which can be part of the electrically resettable fuse device of FIG. 1 according to yet another embodiment of the present invention.

FIG. 4 is a simplified schematic diagram illustrating a resettable fuse module with a global reset signal and local reset signals, which can be part of the electrically resettable fuse device of FIG. 1 according to yet another embodiment of the present invention. As shown in FIG. 4, resettable fuse module 400 is similar to resettable fuse module 300 in FIG. 3. One of the differences between resettable fuse modules 300 and 400 is that in resettable fuse module 400, the reset is controlled by a local reset signal in each resettable fuse module in addition to the global reset signal, which allows the resettable fuse modules in the parallel configuration in resettable fuse device 120 in FIG. 1 to be reset sequentially in a staggered time sequence. As used in the embodiment, the local reset signal is applied to a single resettable fuse module, and a global reset signal is applied to a plurality of resettable fuse module. In some cases, a global reset signal is applied to all resettable fuse modules in the circuit. As shown in FIG. 4, the second NMOS transistor Mn2 and the first PMOS transistor Mp1 are coupled to the inverse of a global reset signal RESET, the first NMOS transistor Mn1 is coupled to the inverse of a local reset signal RESET0, and the third NMOS transistor Mn3 is coupled to the local reset signal RESET0. In this arrangement, the local reset signal in each resettable fuse module can be stagger in time, thereby reducing the power needed for resetting the electrically resettable fuse device.

Figure 5:
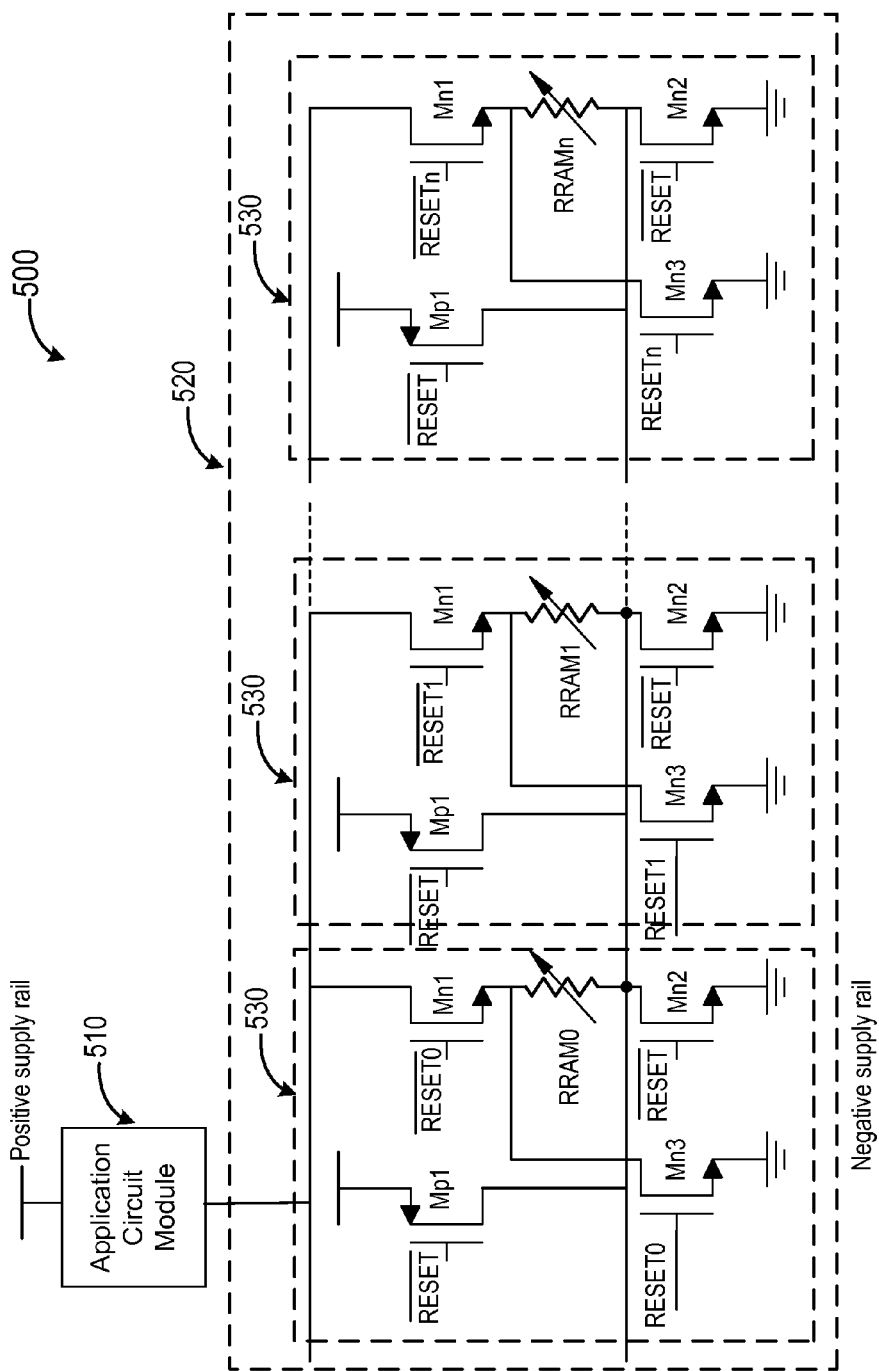
FIG. 5 is a simplified block diagram illustrating an integrated circuit with an electrically resettable fuse device according to an embodiment of the present invention.

FIG. 5 is a simplified block diagram illustrating an integrated circuit with an electrically resettable fuse device according to an embodiment of the present invention. As shown in FIG. 5, integrated circuit 500 includes an application circuit module 510 and an electrically resettable fuse device 520. Integrated circuit 500 is similar to integrated circuit 100 in FIG. 1. Electrically resettable fuse device 520 includes a plurality of resettable fuse modules 530 coupled in parallel. In this embodiment, each resettable fuse module 530 is similar to resettable fuse module 400 depicted in FIG. 4.

As described above, the fuse element can be a non-volatile resistive element such as RRAM characterized by a first and a second impedance states. For example, in a low impedance state, an RRAM element can have a resistance of tens, hundreds, or thousands of ohms. In a high impedance state, an RRAM element can have a resistance of hundreds of thousands or millions ohms. The number of fuse elements and the impedance of each fuse element can be selected depending on the application and circuit design requirements.

Figure 6:
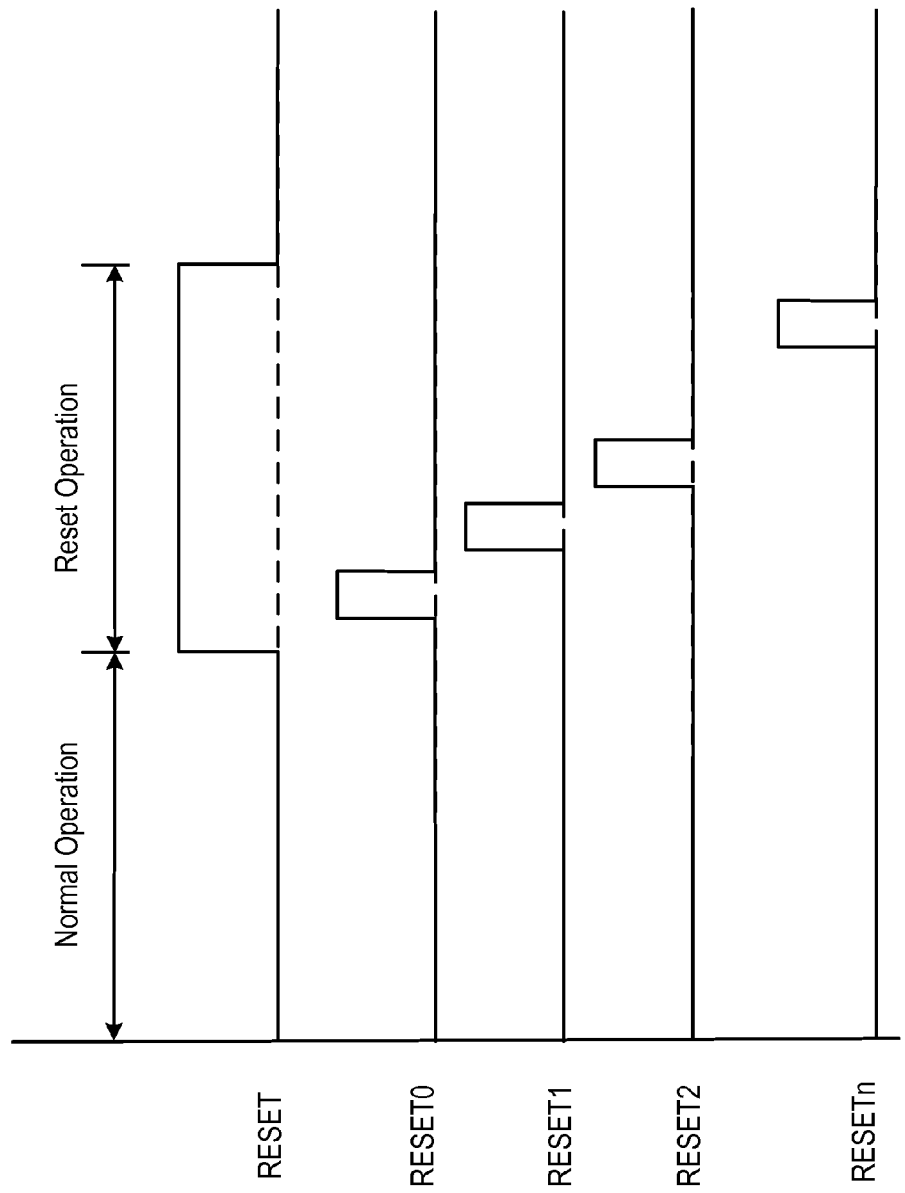
FIG. 6 is a timing diagram illustrating control signals in an electrically resettable fuse device of FIG. 5 according to an embodiment of the present invention.

FIG. 6 is a timing diagram illustrating control signals in electrically resettable fuse device 520 in FIG. 5 as described above according to an embodiment of the present invention. FIG. 6 shows a global reset signal RESET, and a plurality of local reset signals RESET0, RESET1, RESET2, . . . , and RESETn, one for each resettable fuse modules. It can be seen that during normal operation, all reset signals are low. Under this condition, the fuse elements in the low impedance state are coupled in parallel to provide a low-impedance fuse. When an over current condition occurs, the fuse elements are converted into the high impedance state, and the fuse device effectively operates like an open circuit. As shown in FIG. 6, during a reset operation, the global reset signal RESET is set to high, and the local reset signals are set to high in a staggered time sequence. In this arrangement, one fuse element is reset at a time, and the current or power requirement for resetting the fuse device can be reduced. In an alternative embodiment, in which higher power consumption can be accepted, the fuse elements can be reset simultaneously. In this case, the local reset signals are similar to the global reset signal, and the reset operation can be carried out in a shorter time.

FIGS. 7-9 are simplified block diagrams illustrating various configurations for an electronic circuit having an electrically resettable fuse device according to embodiments of the present invention. FIG. 7 shows an integrated circuit module (IC) coupled in series with an electrically resettable fuse device (Fuse Device), with the IC connected to the positive supply rail and the Fuse Device connected to the negative supply rail. In FIG. 7, the electrically resettable fuse device can be similar to those devices depicted above in connection with FIGS. 1-6. FIG. 8 shows an integrated circuit module (IC) coupled in series with an electrically resettable fuse device (Fuse Device), with the IC connected to the negative supply rail and the Fuse Device connected to the positive supply rail. In FIG. 8, the electrically resettable fuse device can still be similar to those devices depicted above in connection with FIGS. 1-6. However, in order to work with the different power supply arrangement in FIG. 8, the polarities of devices and signals may need to be adjusted accordingly.

For example, using a PMOS transistor to replace an NMOS transistor, and adjusting control signal and power/ground connections. In FIGS. 7 and 8, the integrated circuit module (IC) and the electrically resettable fuse device (Fuse Device) can be formed in separate integrated circuit chips. FIG. 9 shows an integrated circuit (IC) that includes an electrically resettable fuse device (Fuse Device) in the same integrated circuit chip.

The electrically resettable fuse device described above can be used with a control circuit or a processor to implement various circuit monitoring and protection schemes. In an example, a timer can be used for automatically resetting the fuse device after a preset delay time has elapsed after the fuse device has blown. In another example, a counter can be used to limit the number of times the fuse device has been blown and reset. In a specific embodiment, if an overcurrent condition arises, the fuse device blows, and an overcurrent event counter is incremented by one. If count does not exceed a predefined number of acceptable reset events (e.g., in a lifetime or within a power cycle, or within a selected time duration), a delay timer starts a preset delay, after which the fuse device is rest and the IC is restarted. If the count exceeds the predefined number of acceptable events, the fuse device is not automatically reset. In this case, the circuit remains inoperable until a corrective action is taken.

While the above is a description of specific embodiments of the invention, the above description should not be taken as limiting the scope of the invention. It is understood that the examples and embodiments described herein are for illustrative purposes only and that various modifications or changes in light thereof will be suggested to persons skilled in the art and are to be included within the spirit and purview of this application.

What is claimed is:

1. An integrated circuit including an electrically resettable fuse device, the electrically resettable fuse device comprising:
    a plurality of resettable fuse modules coupled in parallel, each resettable fuse module including a fuse element characterized by a first and a second impedance states, the plurality of resettable fuse modules are configured such that:
    when the fuse element is in the first impedance state, and a current flowing through each fuse element in a first direction exceeds a current limit, the fuse element enters into the second impedance state; and
    when the fuse element is in the second impedance state and, in response to a global reset signal and a local reset signal, a current is applied to the fuse element in a second direction opposite the first direction, the fuse element is reset to the first impedance state.

2. The integrated circuit of claim 1, wherein the electrically resettable fuse device is configured such that:
    when each of the fuse element is in the first impedance state, the electrically resettable fuse device is characterized by an impedance lower than a predetermined low impedance value; and
    when each of the fuse element is in the second impedance state, the electrically resettable fuse device is characterized by an impedance higher than a predetermined high impedance value.

3. The integrated circuit of claim 1, wherein each of the fuse element is an RRAM (resistive random access memory) element.

4. The integrated circuit of claim 1, wherein each of the fuse element is a phase change resistive element, a magneto-resistive random-access memory element or a conductive bridge random-access memory element.

5. The integrated circuit of claim 1, wherein the electrically resettable fuse device is configured such that the fuse elements in the plurality of resettable fuse modules are reset in a staggered time sequence, thereby reducing the power needed for resetting the electrically resettable fuse device.

6. The integrated circuit of claim 1, wherein each resettable fuse module further comprises first, second, third, and fourth switch devices coupled to the fuse element, wherein:
    the first switch device, the fuse element, and the second switch device are coupled in series for providing a conduction path through the fuse element in the first direction; and
    the third switch device, the fuse element, and the fourth switch device are coupled in series for providing a conduction path through the fuse element in the second direction.

7. The integrated circuit of claim 6, wherein:
    the first switch device is a first NMOS transistor;
    the second switch device is a second NMOS transistor;
    the third switch device is a first PMOS transistor; and
    the fourth switch device is a third NMOS transistor.

8. The integrated circuit of claim 7, wherein:
    the second NMOS transistor and the first PMOS transistor are coupled to an inverse of the global reset signal;
    the first NMOS transistor is coupled to an inverse of the local reset signal; and
    the third NMOS transistor is coupled to the local reset signal,
    wherein the local reset signal in each resettable fuse module is stagger in time, thereby reducing the power needed for resetting the electrically resettable fuse device.

9. An electronic circuit, comprising:
    a circuit module with a maximum current tolerance; and
    an electrically resettable fuse device;
    wherein the circuit module and the electrically resettable fuse device are coupled in series between a positive supply rail and a negative supply rail;
    wherein the electrically resettable fuse device includes a plurality of resettable fuse modules coupled in parallel, each resettable fuse module including a fuse element characterized by a first and a second impedance states, the plurality of resettable fuse modules being configured such that:
    when each of the fuse element is in the first impedance state and a current flows in each of the fuse elements in a first direction, the electrically resettable fuse device is characterized by an impedance lower than a predetermined low impedance value;
    when a current flowing through the circuit module and the electrically resettable fuse device exceeds the maximum current tolerance of the circuit module, each of the fuse element enters into the second impedance state, and the electrically resettable fuse device is characterized by an impedance higher than a predetermined high impedance value to reduce the current flowing through the circuit module; and
    when a current is applied to each fuse element in a second direction opposite the first direction, in response to one or more reset signals, the fuse element is reset to the first impedance state.

10. The circuit of claim 9, wherein the reset signals are derived from a global reset signal, local reset signals, or a combination thereof.

11. The circuit of claim 9, wherein each of the fuse element is an RRAM element, a phase change resistive element, a magneto-resistive random-access memory element, or a conductive bridge random-access memory element.

12. The circuit of claim 9, wherein the electrically resettable fuse device is configured such that the fuse elements in the plurality of resettable fuse modules are reset in a staggered time sequence, thereby reducing the power needed for resetting the electrically resettable fuse device.

13. The circuit of claim 9, wherein each resettable fuse module further comprises first, second, third, and fourth switch devices coupled to the fuse element, wherein:
the first switch device, the fuse element, and the second switch device are coupled in series for providing a conduction path through the fuse element in the first direction; and
the third switch device, the fuse element, and the fourth switch device are coupled in series for providing a conduction path through the fuse element in the second direction.

14. The circuit of claim 13, wherein:
the first switch device is a first NMOS transistor;
the second switch device is a second NMOS transistor;
the third switch device is a first PMOS transistor; and
the fourth switch device is a third NMOS transistor.

15. The integrated circuit of claim 14, wherein:
the first NMOS transistor is coupled to an inverse of a global reset signal;
the second NMOS transistor is coupled to the inverse of the global reset signal;
the first PMOS transistor is coupled to the inverse of the global reset signal; and
the third NMOS transistor is coupled to the global reset signal.

16. The circuit of claim 9, wherein the electrically resettable fuse device is connected to the most positive supply rail.

17. The circuit of claim 9, wherein the electrically resettable fuse device is connected to the most negative supply rail.

18. The circuit of claim 9, wherein the circuit module and the electrically resettable fuse device are formed in two separate integrated circuit chips.

19. The circuit of claim 9, wherein the circuit module and the electrically resettable fuse device are formed in a single integrated circuit chip.

20. A fuse device, comprising:
a plurality of resettable RRAM (resistive random access memory) fuse modules;
a global reset signal line; and
a local reset signal line for each of the plurality of resettable RRAM fuse modules; wherein:
each resettable RRAM fuse module includes an RRAM element and four switch devices that are coupled to either the global reset signal line or the local reset signal line,
a first switch device, the RRAM element, and a second switch device are coupled in series for providing a conduction path through the RRAM element in a first direction,
a third switch device, the RRAM element, and a fourth device coupled in series for providing a conduction path through the RRAM element in a second direction.

* * * * *